United States Patent [19]

Fang et al.

[11] Patent Number: 4,532,698
[45] Date of Patent: Aug. 6, 1985

[54] METHOD OF MAKING ULTRASHORT FET USING OBLIQUE ANGLE METAL DEPOSITION AND ION IMPLANTATION

[75] Inventors: Frank F. Fang, Yorktown Heights; Bertrand M. Grossman, New York; Wei Hwang, Armonk, all of N.Y.

[73] Assignee: International Business Machines Corporation, Armonk, N.Y.

[21] Appl. No.: 623,810

[22] Filed: Jun. 22, 1984

[51] Int. Cl.³ ............... H01L 21/283; H01L 21/22; H01L 21/265
[52] U.S. Cl. .................... 29/571; 29/576 B; 29/579; 148/1.5; 148/187; 148/DIG. 82; 357/91
[58] Field of Search ............ 29/571, 576 B, 579; 148/1.5, 187; 357/91

[56] References Cited

U.S. PATENT DOCUMENTS

| | | | |
|---|---|---|---|
| 3,846,822 | 11/1974 | Riley et al. | 357/23 |
| 3,873,371 | 3/1975 | Wolf | 148/1.5 |
| 4,093,503 | 6/1978 | Harris et al. | 156/628 |
| 4,135,289 | 1/1979 | Brews et al. | 29/571 |
| 4,232,439 | 11/1980 | Shibata | 29/579 |
| 4,280,854 | 7/1981 | Shibata et al. | 148/1.5 |
| 4,313,782 | 2/1982 | Skoloski | 29/571 |
| 4,325,747 | 4/1982 | Ristow | 148/1.5 |
| 4,358,340 | 11/1982 | Fu | 29/571 |
| 4,377,899 | 3/1983 | Otani et al. | 29/571 |
| 4,430,791 | 2/1984 | Dockerty | 29/571 |

OTHER PUBLICATIONS

J. Vac. Sci. & Tech. 19, (3), pp. 693–695, (1981)–"A Simple Method for Fabricating Submicron Lines", by J. L. Speidell.

IBM Technical Disclosure Bulletin, vol. 16, No. 10, Mar. 1974, pp. 3287–3288, "Lateral Nonuniform Doping of Semiconductor Structures by Ion Implantation", by Brack et al.

IBM Technical Disclosure Bulletin, vol. 20, No. 6, Nov. 1977, p. 2454, "Means to Ion Implant Thin Polycrystalline Silicon Gates Without Implanting Ions into Insulating Layer Beneath Gate", by J. A. VanVechten.

*Primary Examiner*—Upendra Roy
*Attorney, Agent, or Firm*—Alvin J. Riddles

[57] ABSTRACT

The combined use of an angularly deposited mask with a subsequent angular conductivity conversion operation extending partially under the mask permits both shorter dimensions and the ability to accommodate the straggle location change when subsequent processing steps occur. The mask is deposited at a low angle with respect to a planar surface, a subsequent conductivity conversion, such as ion implantation, extends under the mask, the mask is removed and a smaller gate is positioned in its location, the gate being smaller than the distance from the source to the point where the conversion extended under the mask, providing thereby an ultra-short gate FET.

5 Claims, 6 Drawing Figures

METHOD OF MAKING ULTRASHORT FET USING OBLIQUE ANGLE METAL DEPOSITION AND ION IMPLANTATION

DESCRIPTION

1. Technical Field

The technical field of the invention is in the fabrication of semiconductor devices and in particular to field effect transistor (FET) devices wherein the dimensions involved are less than a micron ($\mu$m).

As the speed of response and the packing density of devices in electronic apparatus such as integrated circuits increases, the dimensions required become so small that the specifications are exceeding the tolerances of conventional production processes and apparatus employed in production. Indirect techniques to achieve spacings are being found essential to meet the required dimensions.

2. Background Art

One indirect technique that is currently receiving attention in the art for achieving such very small dimensions is the use of the horizontal or vertical component of a processing operation that is conducted at an angle with respect to the surface on which the device being fabricated is to be formed. The angle processing technique has been used in the art in both deposition and in ion implantation processes. As one illustration, angled deposition is used to form small electrodes as is described in J. Vac. Sci. & Tech. 19, p. 693–696 (1981).

As another illustration the technique of ion implantation is performed at an angle as described in U.S. Pat. Nos. 3,873,371, 4,325,747 and 4,232,439.

Still another indirect technique is the locating source and drain electrodes in FET transistors by using the gate electrode as a mask. This technique has come to be known in the art as self-alignment. It is described in U.S. Pat. No. 3,846,822 involving ion beam milling.

DISCLOSURE OF THE INVENTION

Figure 1:
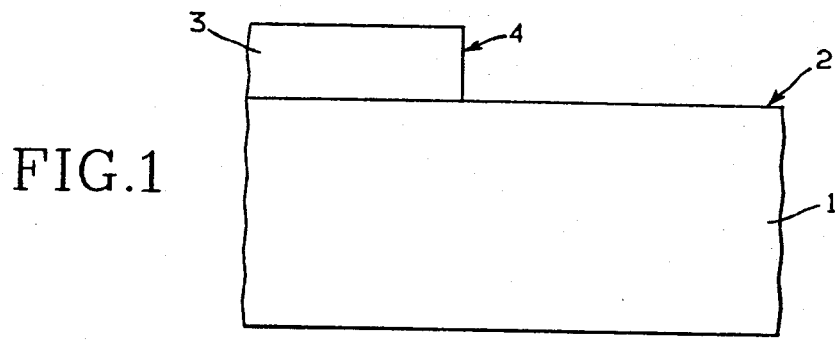
FIGS. 1-6 are schematic illustrations of the intermediate structural features employed in the steps of fabrication of the invention.

The combined use of an angularly deposited mask with a subsequent angular conductivity conversion operation extending partially under that mask permits both shorter dimensions and the ability to accommodate the straggle location change when subsequent processing steps occur.

The mask is deposited at a low angle with respect to a planar surface and a subsequent conductivity conversion, such as ion implantation, extends under the mask providing an ultra-short gate FET.

For clarity of explanation, the fabrication technique will be described in connection with the fabrication of an ultra-short gate self-aligned Metal Oxide Semiconductor Field Effect Transistor (MOSFET) although in the light of the principles set forth, one skilled in the art may readily apply the technique to other structures.

In fabricating ultra-small gates on a MOSFET where the gate is of the order of 0.5 $\mu$m a commonly encountered shorting problem appears in the form of a lateral movement with respect to the source and drain usually by diffusion produced by subsequent processing steps. In other words, the edges of the source and drain electrodes "straggle" with respect to the selected locations.

The technique of the invention involves a first angular deposition against a vertical face which is then used as a mask for a subsequent angular conductivity type conversion such as an ion implantation which extends partly under the mask. The first deposition is then removed and a second angular deposition against the vertical face provides much smaller and very precisely positioned gate, source and drain electrodes. By doing this, the final gate electrode has zero or very small overlap with the source and drain electrodes. This enhances the speed and performance of the device.

BEST MODE FOR CARRYING OUT THE INVENTION

FIGS. 1-6 describe the individual structural features employed at specific steps as the structure is developed. The same reference numerals for like elements are employed throughout the figures.

Referring first to FIG. 1, a semiconductor substrate 1 of a monocrystalline semiconductor material, such as silicon or gallium arsenide, standard in the art is provided with a surface 2 on which the semiconductor device is to be oriented. On a portion of the surface 2 a material 3 is shaped to provide an abrupt locating face 4 essentially vertical with respect to the surface 2. The material 3 is usually insulating such as an oxide. The height of the locating face 4 is about 5,000 Angstroms. The face 4 can be formed by the standard technique in the art of reactive ion etching.

Figure 2:
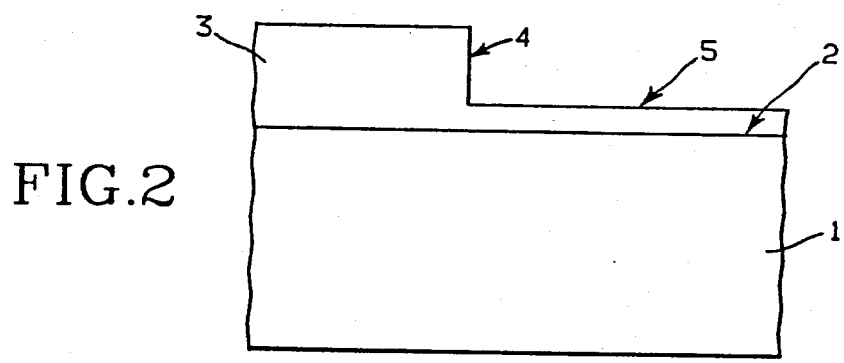

Referring next to FIG. 2 in fabricating a MOSFET, a precise thickness insulator layer 5 is placed on the surface 2, abutting the locating face 4, and will serve as the thickness of the oxide under the gate. The insulator 5 is fairly thin and it is of the order of 1-200 Angstroms. The usual technique for forming the thin insulator layer 5 on silicon is to thermally grow a thin layer of oxide over the bare silicon surface 2.

Figure 3:
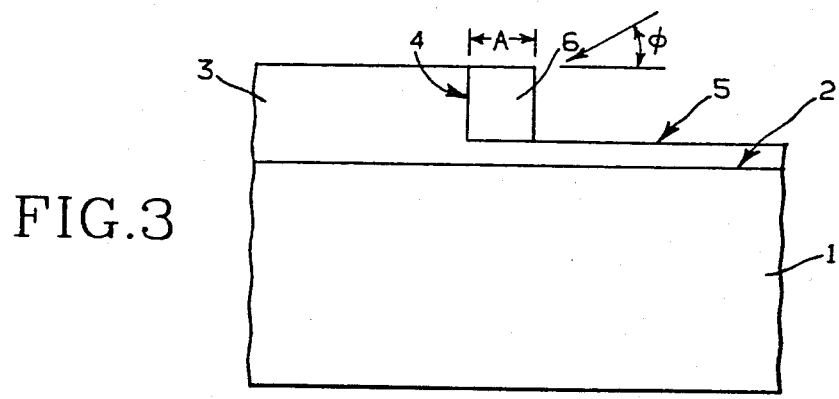

Referring next to FIG. 3, a first angular deposition is performed wherein a metal mask 6 is positioned against the face 4. The metal mask 6 has a horizontal dimension labelled A which is the desired length of the MOSFET gate and an added increment which is the expected "straggle" to be accommodated resulting from, for example, the various diffusions that are to take place at the processing temperatures that may occur. This added increment or delta ($\Delta$) is quite easy to estimate as the specifications for semiconductor materials and the materials therewith are well established. The metal for the mask 6 is deposited against the face 4 at a shallow angle shown as $\phi$ so that a minimum of metal is deposited on the horizontal. The metal that is deposited on the horizontal is so small that it is readily removed by operations such as etching without significantly changing the dimension A. An acceptable range for the angle $\phi$ is from 5° to 25°.

Figure 4:
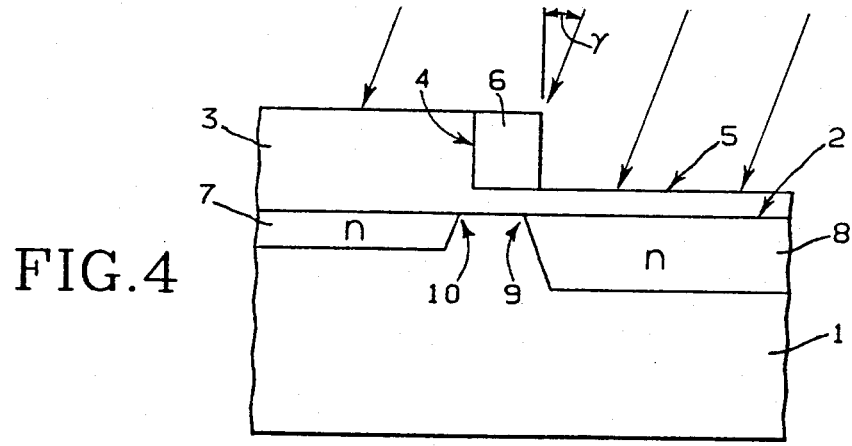

Referring next to FIG. 4, a conductivity type conversion operation such as ion implantation is employed to form the source and drain electrodes. The ion implantation introduces impurities into the crystal 1 to form the regions 7 and 8. In introducing the impurities, damage occurs requiring annealing which contributes to the straggle problem. The estimated straggle is included in the $\Delta$ portion of dimension A.

The ion implantation is performed at an angle labelled $\gamma$ with respect to the vertical and converts the conductivity type of the substrate 1 to the opposite conductivity type in the regions 7 and 8 that will be the source and drain, respectively. The location of one edge of the implanted regions 7 and 8 will be offset by a lateral distance with respect to the mask 6 which is approximately equal to the height of the mask 6 times the tangent of the angle γ of implanting. The offsetting as shown in FIG. 4 moves edge of the drain 8 under the mask 6 at 9 and the source 7 away from the mask 6 at 10.

Figure 5:
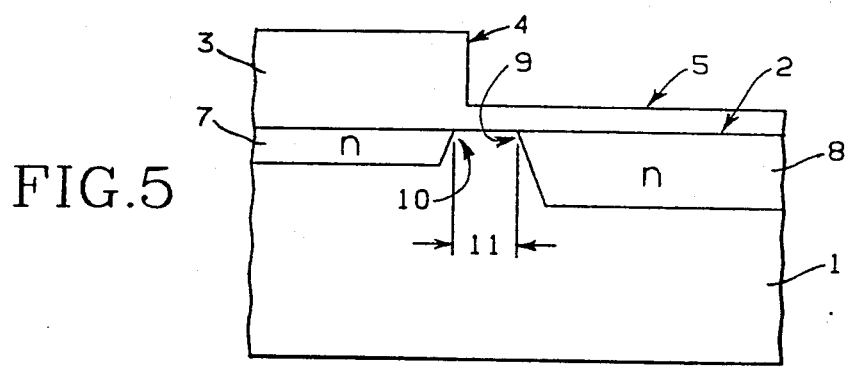

Referring next to FIG. 5, the mask 6 is now removed by such operations as a selective etch and the ion implant damage in 7 and 8 annealed with the resulting slight movement so that the resulting channel length 11 after the annealing step is essentially the predetermined value used in the dimension A of the mask 6 in FIG. 3.

Figure 6:
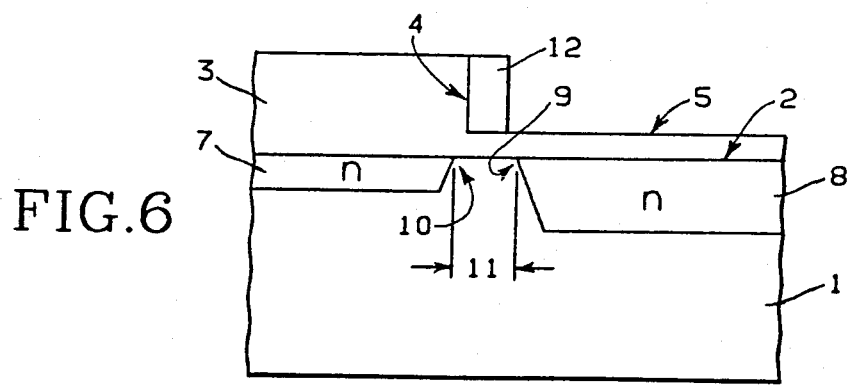

Referring next to FIG. 6, a second angular metal deposition is made against the face 4 providing the metal gate 12. The angle of the deposition is low with respect to the surface 2 so that again there is a minimum of material on the horizontal surfaces for ease of removal and the dimension of the gate 12 parallel to the surface 2 over what is to become the channel of the FET is readily controlled with respect to the dimension 11. This dimension parallel to the surface 2, which is the thickness of the gate 12, is less than the total channel length and as long as the gap between the gate 12 edge and the drain 8 connection is less than one Debye length, all the injected carriers will be collected at the drain 8.

In the completed structure, the initial sidewall 4 remains in place and serves as a supporting structure for the small high aspect ratio gate 12.

External electrical connections, not shown, for device application purposes are made to the source 7, the drain 8 and the gate 12.

The technique of the invention provides an ultra-short gate FET wherein the gate length is of the order of one-half micron wherein lateral shorting has been taken into consideration in the construction, self-alignment takes place with minimized parasitic gate to source and drain overlap capacitance.

What has been described is a combined indirect technique in which a first angularly deposited member serves as a mask for an angularly directed ion implantation extending under the mask. The mask is removed and a gate is deposited against the same locating face used for the mask but the gate is thinner which permits shorter dimensions and accommodation for later processing step movement.

Having thus described our invention, what we claim as new and desire to secure by letters patent is:

1. In the formation of semiconductor structures by the use of indirectly determined dimensions with respect to the surface of a semiconductor crystal, the improvement process comprising forming by depositing at a low angle with respect to said surface a mask member against a positioned locating face, said mask having a dimension parallel to said surface determined by both desired device dimension and processing tolerance movement, and converting the conductivity of the region of said crystal adjacent said surface from an angular direction by ion implantation to cause said conversion to progress to a point under at least a portion of said mask.

2. The process of claim 1 including the steps of
   removing said mask, and
   depositing a device electrode against said locating face having a dimension parallel to said surface less than the distance from said locating face to the point where said conversion progressed under said mask.

3. The process of claim 2 wherein said depositing steps involve vacuum deposition.

4. The process of fabricating a MOSFET transistor comprising in combination the steps of
   forming a perpendicular locating face with respect to a surface of a semiconductor crystal in a material on said surface,
   forming a gate oxide thickness layer on said crystal surface abutting said face,
   depositing from an angle with respect to said surface a mask member of selected thickness, said angle providing a minimum of material on said surface,
   converting the conductivity of said crystal from an angular direction by ion implantation operable to cause said crystal conversion to progress to a point under said mask,
   removing said mask, and
   depositing a gate electrode against said face in a thickness less than the distance from said face to said point of conversion progress under said mask.

5. The process of claim 4 where an annealing step is performed before said gate electrode deposition.

* * * * *